(12) United States Patent
Kim et al.

(10) Patent No.: US 8,154,920 B2
(45) Date of Patent: Apr. 10, 2012

(54) METHOD OF READING DATA AND METHOD OF INPUTTING AND OUTPUTTING DATA IN NON-VOLATILE MEMORY DEVICE

(75) Inventors: In-Mo Kim, Gyeonggi-do (KR); Jae-Yong Jeong, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 233 days.

(21) Appl. No.: 12/712,769

(22) Filed: Feb. 25, 2010

(65) Prior Publication Data
US 2010/0226172 A1  Sep. 9, 2010

(30) Foreign Application Priority Data
Mar. 6, 2009  (KR) .................. 10-2009-0019331

(51) Int. Cl.
*G11C 16/04* (2006.01)
(52) U.S. Cl. .............................. 365/185.03; 365/185.18
(58) Field of Classification Search ............. 365/185.03, 365/185.18
See application file for complete search history.

(56) References Cited

U.S. PATENT DOCUMENTS

| | | | | |
|---|---|---|---|---|
| 5,278,785 | A * | 1/1994 | Hazani | 365/185.16 |
| 5,784,327 | A * | 7/1998 | Hazani | 365/189.03 |
| 6,349,059 | B1 | 2/2002 | Bartoli et al. | |
| 2006/0140043 | A1 | 6/2006 | Roohparvar et al. | |
| 2009/0059661 | A1* | 3/2009 | Yang et al. | 365/185.2 |

FOREIGN PATENT DOCUMENTS

| | | |
|---|---|---|
| KR | 1020030009298 | 1/2003 |
| KR | 10-0648285 | 11/2006 |

* cited by examiner

*Primary Examiner* — Tuan T. Nguyen
(74) *Attorney, Agent, or Firm* — F. Chau & Associates, LLC

(57) ABSTRACT

A method of reading data in a non-volatile memory device based on the logic level of a selection bit of an address, determines an order of reading a first and second bits of data stored in one multi-level memory cell corresponding to the address based on the logic level of the selection bit, and senses and outputs the first and second bits of data according to the determined order of reading. The method of reading data in a non-volatile memory device and the method of inputting and outputting data in a non-volatile memory device may reduce the initial read time by selecting the order of reading the first and second bits of data stored in the multi-level memory cell and reading the data according the order based on the start address.

21 Claims, 16 Drawing Sheets

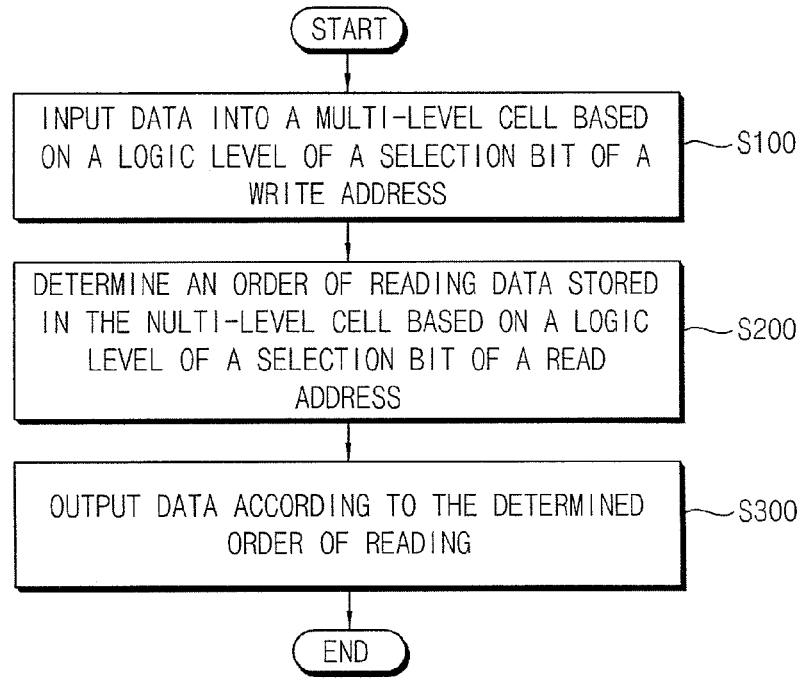
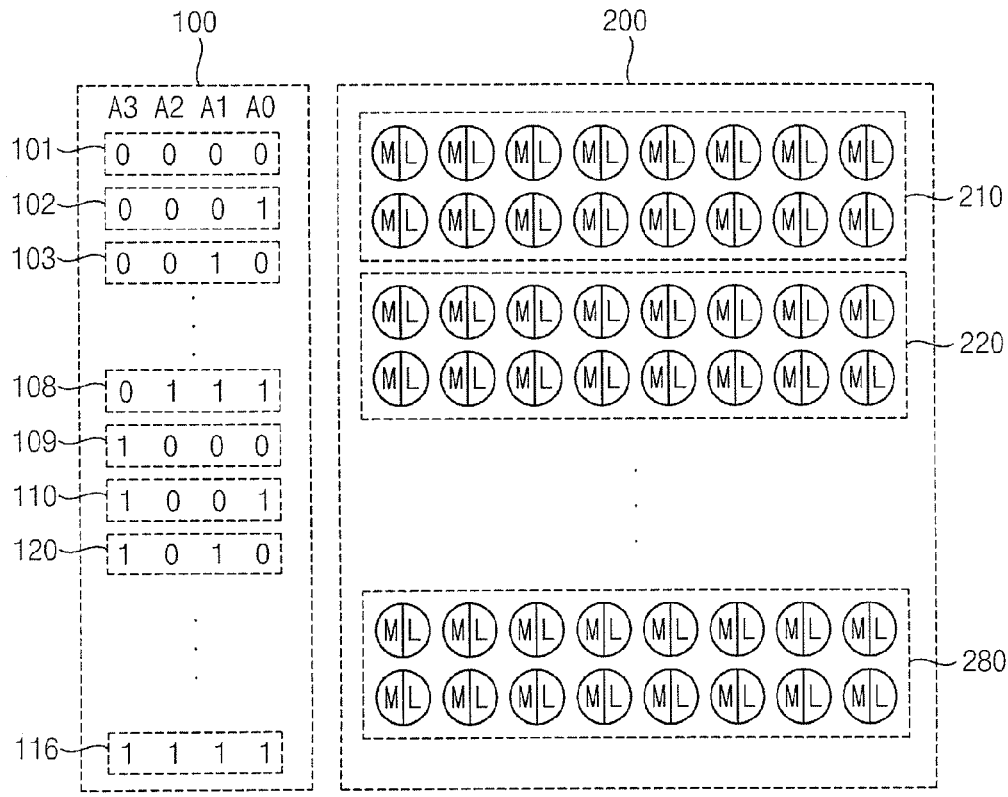

METHOD OF READING DATA AND METHOD OF INPUTTING AND OUTPUTTING DATA IN NON-VOLATILE MEMORY DEVICE

CROSS-REFERENCE TO RELATED APPLICATIONS

This application claims priority, under 35 USC §119, of Korean Patent Application No. 2009-0019331, filed on Mar. 6, 2009 in the Korean Intellectual Property Office (KIPO), the contents of which are herein incorporated by reference in their entirety.

BACKGROUND

1. Technical Field

The present invention relates to a non-volatile memory device, and more particularly to a method of reading data from a non-volatile memory device and method of inputting and outputting data using the method of reading data.

2. Description of the Related Art

Semiconductor memory devices are microelectronic devices that are widely used in the design of digital logic circuits such as microprocessor-based applications and computers for products ranging from satellites to consumer electronics. Advances in memory devices have raised the performance of digital logic systems.

Semiconductor memory devices are generally classified into volatile memory devices and nonvolatile memory devices. The nonvolatile memory devices can retain data even when power supply is disconnected. Data stored in the non-volatile memory devices may be permanent (read only) or reprogrammable (write, read). The nonvolatile memory devices are now widely used to store executable programs or microcodes in various applications such as computers, avionics, communications, and consumer electronic technologies.

An example of the nonvolatile memory device is a flash memory device. A flash memory device may be classified into a single-level cell (SLC) type and a multi-level cell (MLC) type according to the number of bits stored in one memory cell. The single-level cell (SLC) stores a logic level of one bit in one memory cell, and each cell is characterized by one specific threshold voltage, or one Vt level.

FIG. 6A is a circuit diagram illustrating a conventional multi-level cell (MLC) of a non-volatile memory device. Each multi-level cell (MLC) stores logic levels of two or more bits in one memory cell. In MLC technology, the threshold voltage of each cell has been divided into greater than two levels. FIG. 6B is a threshold voltage distribution diagram illustrating an example of threshold voltages of a multi-level cells and the logic states corresponding to the threshold voltages. A multilevel cell, for storing n bits per cell, is programmed on $m=2^n$ voltage levels. In FIG. 6B, the multi-level cell (MLC) stores two (n=2) bits in each one memory cell, and thus has four ($m=2^2$) threshold voltages. Architecturally, Flash Memory is classified into two types, namely NOR Flash Memory and NAND Flash Memory. A NOR-based Multi-Level Cell architecture provides direct memory-cell access. NAND-based flash has no provision for a random-access. Memory cells are organized serially in NAND-based flash architecture owing to which the data is read block-wise basis. The typical block sizes may comprise of multiple bits in thousands.

The size of a memory device may be reduced when the memory device is operated as the multi-level cell (MLC) type since the multi-level cell may store more bits in one memory cell than the single-level cell. However, as the number of bits stored in the multi-level cell increases, a plurality of read voltages must be applied to the multi-level cells in order to read data from the multi-level cell, and thus an initial read time including the sensing time and the output time increases, thereby degrading performance of the memory device.

In a synchronized reading operation in a non-volatile memory device such as a flash memory, the sensing time for sensing data stored in a memory cell and the output time for outputting the sensed data delays the output of valid data. When the sensing time and the output time become longer, performance of the non-volatile memory device operates is degraded. Therefore, it is desirable to reduce the sensing time and the output time for enhancing the operation speed (frequency) of the non-volatile memory device.

SUMMARY OF THE INVENTION

Exemplary embodiments of the invention provide a method of reading data in a non-volatile memory device, capable of reducing an initial read time.

An aspect of the invention provides a method of inputting and outputting data in a non-volatile memory device, capable of reducing an initial read time.

In a method of reading data in a non-volatile memory device according to some exemplary embodiments, the logic level of a selection bit of an address is used The order of reading a plurality of bits of data stored in one multi-level cell corresponding to the address is selected based on the logic level of the selection bit, and the plurality of bits of data is sensed and outputted according to the selected order of reading.

At least one bit of data among the plurality of bits of data may be outputted before sensing all of the plurality of bits of data.

The order of reading the plurality of bits of data may be selected by selecting an order of applying a plurality of read voltages to a word line connected to the multi-level cell based on the logic level of the selection bit.

The plurality of bits of data may be sensed and outputted by sensing one bit of data among the plurality of bits of data by applying at least one read voltage among the plurality of read voltages to the word line according to the selected order of applying read voltages, and outputting the at least one bit of data regardless of applying remaining other read voltage(s) among the plurality of read voltages.

The plurality of bits of data may be sensed and outputted by sensing and outputting the remaining bit of data among the plurality of bits of data by applying the remaining read voltage among the plurality of read voltages to the word line in parallel with outputting the at least one bit of data.

The plurality of bits may include a first bit and a second bit, and the plurality of read voltages may include a first read voltage, a second read voltage and a third read voltage, and the order of reading the plurality of bits of data may be selected by selecting the optimal order of applying the first read voltage, the second read voltage and the third read voltage based on the logic level of the selection bit.

The order of reading the plurality of bits of data may be selected by choosing between: applying the first read voltage, the second read voltage and the third read voltage in the order so that output the first bit of data first if the logic level of the selection bit is in a first logic level, and applying the first read voltage, the third read voltage and the second read voltage in the order so that output the second bit of data first if the logic level of the selection bit is in a second logic level.

The address may be a start address of read data corresponding to one page.

In a method of inputting and outputting data in a non-volatile memory device according to some exemplary embodiments, in a writing mode data is selectively inputted into one bit among a plurality of bits of one multi-level cell based on the logic level of a selection bit of a write address, and in a reading mode the order of reading the plurality of bits of data stored in the multi-level cell is selected based on a logic level of a selection bit of a read address, and the plurality of bits of data is outputted according to the determined order of reading.

Another aspect of the invention provides an apparatus comprising a nonvolatile memory device including: an array of n-level memory cells including a plurality 2x of n-word units, wherein n is an integer greater than one, and each of the n-word units includes a plurality of the n-level memory cells; an address decoder configured to receive an x-bit address and to select a selected one of the 2x of n-word units based on the received x-bit address, wherein the x-bit address is a portion of the bits of a received address; a selection bit detector configured to detect the logic level of a selection bit of the received address, wherein the selection bit is not a bit of the x-bit address.

Data may be inputted by determining the logic level of the selection bit of the write address, inputting data into a first bit of the multi-level cell if the logic level of the selection bit of the write address is in a first logic level, and inputting data into a second bit of the multi-level cell if the logic level of the selection bit of the write address is in a second logic level.

Various exemplary embodiments will be described more fully with reference to the accompanying drawings, in which some exemplary embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element or bit from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to or shown in the figures as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 1 is a flow chart of a method of inputting and outputting data in a non-volatile memory device according to some exemplary embodiments of the invention;

FIG. 2 is a block diagram of a non-volatile memory device having an address block 100 and a memory cell array 200 having a plurality of multi-level cells corresponding to the addresses in a writing mode;

DETAILED DESCRIPTION OF THE EXEMPLARY EMBODIMENTS OF THE INVENTION

Figure 3A:
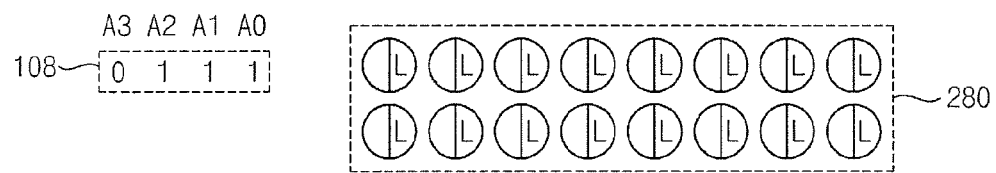
FIGS. 3A and 3B are block diagrams each illustrating one address and a plurality of multi-level cells in the n-word cell unit corresponding to the one address, in the non-volatile memory device of FIG. 2.

FIG. 1 is a flow chart of a method of inputting and outputting data in a non-volatile memory device according to some exemplary embodiments.

Referring to FIG. 1, data is selectively inputted into a multi-level cell (MLC) based on a logic level of a selection bit of a write address in a writing mode (step S100). The order of reading the plurality of bits of data stored in the multi-level cell is determined based on the logic level of the selection bit of a read address in a reading mode (step S200) and then the plurality of bits of data is outputted according to the determined order of reading (step S300).

In a writing mode, data is selectively inputted into some bit among a plurality of bits of the multi-level cell based on the logic level of the selection bit of the address. The selection bit may be some bit included in the address, and at least one bit among the plurality of bits of the multi-level cell may be selected by the selection bit of the address. For example, when two bits (i.e., four threshold voltages) are stored in the multi-level cell, the selection bit may include one bit and an upper bit or a lower bit of the multi-level cell may be selected based on the logic level of the selection bit.

In a reading mode, the order of reading the plurality of bits of data stored in the multi-level cell may be determined based on the logic level of the selection bit of the address. The plurality of bits of data of the multi-level cell may be outputted according to the determined order of reading.

FIG. 2 is a block diagram illustrating of a non-volatile memory device having an address block 100 and a memory cell array 200 having a plurality of multi-level cells corresponding to the addresses in a writing mode.

Referring to FIG. 2, the address block 100 includes a plurality of addresses 101 to 116, and the memory cell array 200 includes a plurality of multi-level cells 210 to 280. The address block 100 of FIG. 2 includes a selection bit detector (1020 in FIG. 10) and a conventional address decoder (1060 in FIG. 10). The conventional address decoder (1060 in FIG. 10) functions as a wordline selector (demultiplexer) for applying word line voltages (e.g., generated by the voltage unit 1050 shown in FIG. 10) onto the selected world line within the memory cell array 200. A conventional address decoder (1060 in FIG. 10) is conventionally connected between a voltage generation unit (e.g. 1050 shown in FIG. 10) configured to generate word line voltages and the memory cell array 200 including a plurality of wordlines. The address block 100 of FIG. 2 includes addresses for one page of data, and the memory cell array 200 of FIG. 2 includes multi-level cells for one page of data. The conventional address decoder (1060 in FIG. 10) is a demultiplexer. A demultiplexer is the inverse of a multiplexer, in that for example it takes a single signal line input and x-bit address inputs and has $2^x$ outputs. The x-bit address input determines which output wordline is going to have the same voltage level as the input wordline signal. In a preferred embodiment, all of the multi-level memory cells of each n-word cell unit (e.g., in 210) share a common wordline and correspond to the same x-bit input address received by the address decoder (1060 in FIG. 10), in the non-volatile memory device of FIG. 2. The x-bit input address received by the address decoder (1060 in FIG. 10) does not include the selection bit(s) of a received read/write address that are detected by a selection bit detector (1020 in FIG. 10).

The address block 100 may include sixteen addresses 101 to 116 and each of the addresses 101 to 116 indicates a plurality of multi-level cells storing one word of data. Thus, each of the addresses 101 to 116 may indicate upper bits M or lower bits L of the plurality of multi-level cells 210 to 280 storing 16 bits of data.

In some exemplary embodiments, in the writing mode, data may be selectively inputted into some bit among the plurality of bits of the multi-level cell based on the logic level of the selection bit of the address.

Firstly, the logic level of the selection bit of the address is determined to perform the write operation. When the logic level of the selection bit of the address is in a first logic level, data corresponding to the address is inputted into a first bit of the multi-level cell. When the logic level of the selection bit of the address is in a second logic level, data corresponding to the address is inputted into a second bit of the multi-level cell. For example, the first logic level may be a logic low level and the second logic level may be a logic high level. The first bit may be a lower bit (least significant bit, LSB) of the multi-level cell and the second bit may be an upper bit (most significant bit, MSB) of the multi-level cell. The first logic level and the second logic level, and the first bit and the second bit of the multi-level cell may be defined differently in other embodiments.

In the writing mode of the non-volatile memory device, data may be inputted in a unit of one page. Each one page may comprise one entire NAND string of nonvolatile memory cells and includes a plurality of words of data. One word may include a plurality of bits of data. For example, each one page may include sixteen words of data, and each one word may include sixteen bits of data. The address block 100 of FIG. 2 includes addresses for one page of data, and the memory cell array 200 of FIG. 2 includes multi-level cells for one page of data. The memory cell array 200 of FIG. 2 is only an illustrative example, and the memory cell array 200 may include more multi-level cells corresponding to a plurality of pages.

In order to select one word of data among sixteen words of data included in one page, each of the addresses may include at least four bits. In FIG. 2, each of the address 101 to 116 includes a first address bit A3, a second address bit A2, a third address bit A1 and a fourth address bit A0. The first address bit A3 may be the most significant bit of the address and the fourth address bit A0 may be a least significant bit of the address. The most significant bit (i.e., the first address bit A3) may be designated as the selection bit.

The addresses 101 to 116 may be grouped into a first address group 101 to 108 and a second address group 109 to 116 based on the logic level of their selection bits A3.

The memory cell array 200 may include the plurality of multi-level cells, each of which stores a plurality of bits of data. For example, each of the plurality of multi-level cells may store two bits of data including a first bit L and a second bit M. The first bit L may be a lower bit and the second bit M may be an upper bit.

In the writing mode, data may be selectively inputted into the first bit L or into the second bit M of the multi-level cell based on the logic level of the selection bit A3. For example, if the logic level of the selection bit A3 is determined, then data corresponding to addresses in the first address group 101 to 108 which have their selection bits A3 at the logic low level is inputted into the first bit L of the multi-level cells. Data corresponding to addresses in the second address group 109 to 116 which have their selection bits A3 at the logic high level may be inputted into the second bit M of the multi-level cells.

Hereinafter, the method of inputting data into the non-volatile memory device according to some exemplary embodiments will be described in detail.

The selection bit A3 of a first address 101 among the sixteen addresses 101 to 116 is detected. Since the selection bit A3 of the first address 101 is at the logic low level ("0"), data corresponding to the first address 101 may be inputted into the first bit L among the two bits L and M of each of the plurality of multi-level cells included in a first n-word cell unit 210. The first n-word cell unit 210 comprises a plurality (e.g., 16) of multilevel memory cells (MLC) each configured to store n bits of data, and thus the first n-word cell unit 210 has the capacity to store n words of data (e.g., n sixteen bit words of data). In the exemplary embodiment shown in FIG. 2, n=2 and thus each of the multilevel memory cells (MLC) is configured to store 2 bits (M and L) of data, and thus the first n-word cell unit 210 has the capacity to store two words of data (e.g., two sixteen bit words of data). Since each one address indicates one word of data and each one word of data may include sixteen bits of data, data corresponding to each one address may be inputted into one (M or L) bit of the sixteen multi-level cells as shown in first n-word cell unit 210 in FIG. 2. Since the selection bit A3 of a second address 102 is also at the logic low level ("0"), data corresponding to the second address 102 may also be inputted into the first bit L among the two bits L and M of each of the plurality of multi-level cells included in the second n-word cell unit 220. In this manner, all data corresponding to addresses in the first address group 101 to 108 which have their selection bits A3 at the logic low level is inputted into the first (L) bits (i.e., the lower bits) of the plurality of multi-level cells in the corresponding n-word cell units.

Since the selection bit A3 of a ninth address 109 is at the logic high level ("1"), data corresponding to the ninth address 109 is inputted into the second bit M among the two bits L and M of each of the plurality of multi-level cells included in the first n-word cell unit 210. Since the selection bit A3 of a tenth address 110 is also at the logic high level ("1"), data corresponding to the tenth address 110 is inputted into the second bit M among the two bits L and M of each of the plurality of multi-level cells included in the second n-word cell unit 220. In this manner, data corresponding to addresses in the second address group 109 to 116 which have their selection bits A3 at the logic high level ("1") may be inputted into the second bit M (i.e., the upper bit) of each of the plurality of multi-level cells.

Figure 3B:
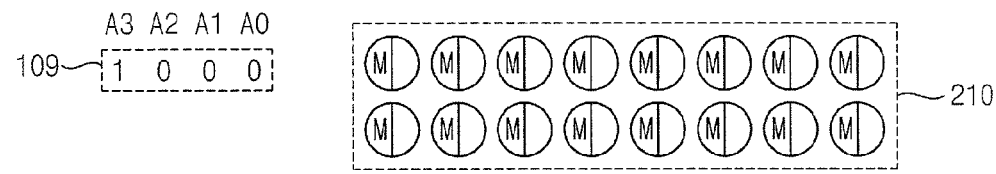

FIGS. 3A and 3B are block diagrams each illustrating one address and a plurality of multi-level cells in the n-word cell unit corresponding to the one address, in the non-volatile memory device of FIG. 2.

Referring to FIG. 3A, data corresponding to the eighth address 108 which has its selection bit A3 at the logic low level ("0") is inputted into the first bit L of the plurality of multi-level cells included in the eighth n-word cell unit 280.

Referring to FIG. 3B, data corresponding to the ninth address 109 which has its selection bit A3 at the logic high level ("1") is inputted into the second bit M of each of the plurality of multi-level cells included in the first n-word cell unit 210.

Figure 4:
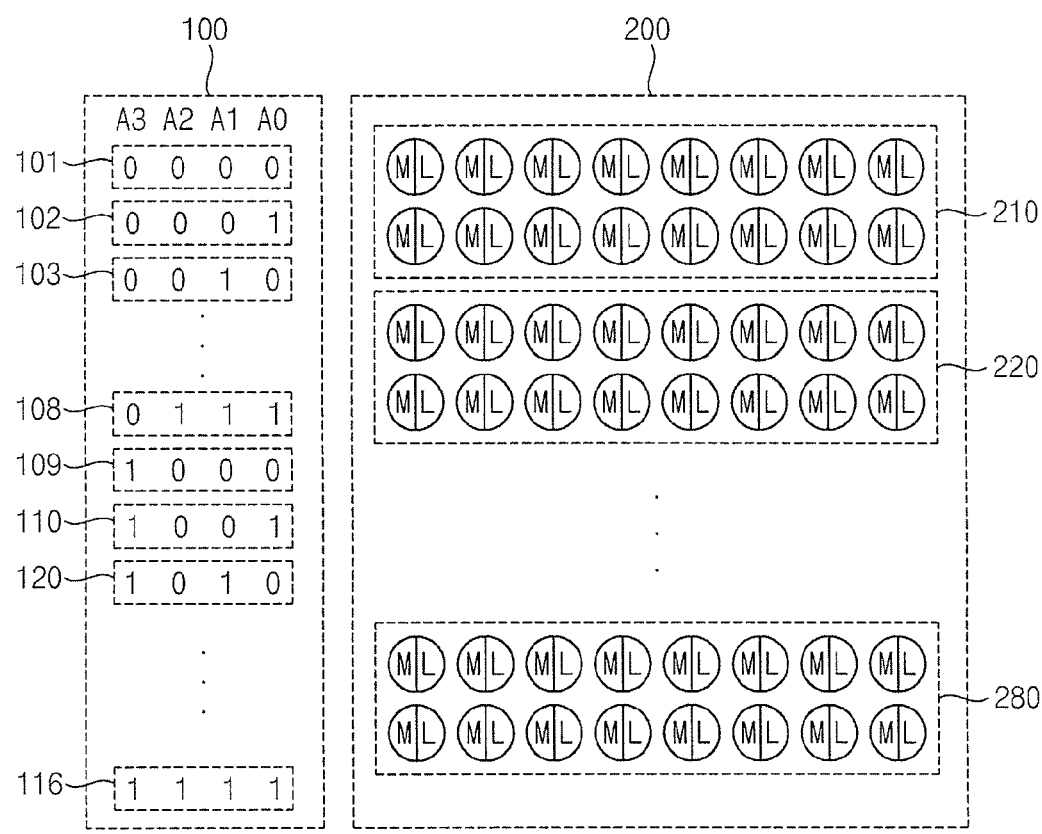
FIG. 4 is a block diagram of the non-volatile memory device of FIG. 2 in a reading mode.

FIG. 4 is a block diagram of the non-volatile memory device of FIG. 2 in a reading mode.

Referring to FIG. 4, the address block 100 includes the plurality of addresses 101 to 116, and the memory cell array 200 includes the plurality of multi-level cells arranged in n-word cell units 210 to 280.

In the reading mode, the order of reading the plurality of bits of data stored in the multi-level cells may be determined based on the logic level of the selection bit of the address. The plurality of bits of data are outputted according to the determined order of reading.

The order of reading the first bit L and of the second bit M stored in the multi-level cell may be determined based on the logic level of the selection bit A3. For example, when the selection bit A3 is at the logic low level ("0"), the first bit L of the multi-level cell is read first, and when the selection bit A3 is at the logic high level ("1"), the second bit M of the multi-level cell is read first.

Hereinafter, the method of outputting data in the non-volatile memory device according to some exemplary embodiments will be described in detail.

Data may be outputted from the nonvolatile memory device of FIG. 4 by unit of page, and a start address of data to be read out may be included in the first address group 101 to 108 or in the second address group 109 to 116. Thus, the logic level of the selection bit A3 of the start address may be at the logic low level or at the logic high level.

When the start address is the first address 101 among the sixteen addresses 101 to 116, the value of the selection bit A3 of the start address is determined or detected or known to be the value of the selection bit A3 of the first address 101. Since the selection bit A3 of the start address is that of the first address 101 and thus is at the logic low level, the logic level of the first bit L among the two bits L and M of the plurality of multi-level cells included in the first n-word cell unit 210 are read first. When the start address is the second address 102, since the selection bit A3 of the start address is that of the second address 102 and is thus at the logic low level, the logic levels of the first bit L among the two bits L and M of each of the plurality of multi-level cells included in the second n-word cell unit 220 are read first. When the start address is the ninth address 109, since the selection bit A3 start address is that of the ninth address 109 and thus is at the logic high level, the logic levels of the second bit M among the two bits L and M of each of the plurality of multi-level cells included in the first n-word cell unit 210 are read first. When the start address is the tenth address 110, since the selection bit A3 of the start address is that of the tenth address 110 and is thus also at the logic high level, the logic levels of the second bit M among the two bits L and M of each of the plurality of multi-level cells included in the second n-word cell unit 220 are read first.

FIGS. 5A to 5D are diagrams each illustrating orders of reading data in various reading modes. In FIGS. 5A to 5D, a first address group 510 may correspond to the first bits L of the multi-level cells on a page, and a second address group 520 may correspond to the second bits M of the same multi-level cells on the page.

Figure 5A:
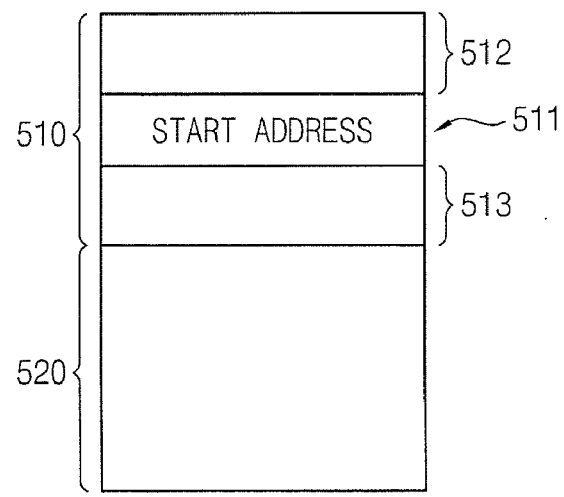
FIGS. 5A to 5D are diagrams each illustrating orders of reading data in various reading modes.

Referring to FIG. 5A, in a successive reading mode, data corresponding to an address range from the start address to a last address of the page may be read as follows. When the selection bit of the start address is at the logic low level, data 511 corresponding to the start address START ADDRESS, data 513 corresponding to a portion of the first address group 510, and data corresponding to the second address group 520 may be read in that order. Thereafter, data corresponding to a next page including other multi-level cells may be read.

Figure 5B:
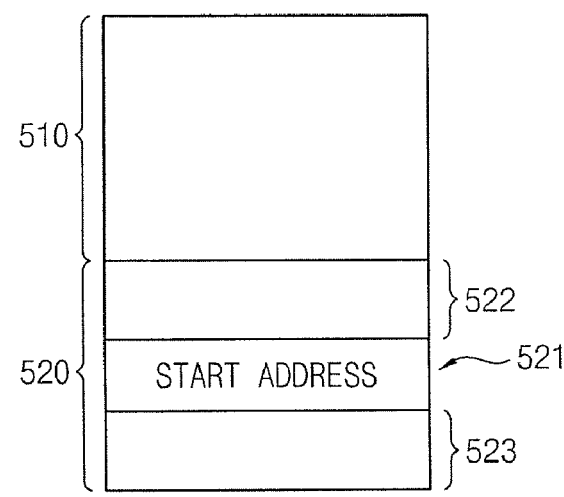

Referring to FIG. 5B, in the successive reading mode, when the selection bit of the start address is at the logic high level, data 521 corresponding to the start address START ADDRESS and data 523 corresponding to a portion of the second address group 520 may be read in that order. Thereafter, data corresponding to the next page including other multi-level cells may be read.

Figure 5C:
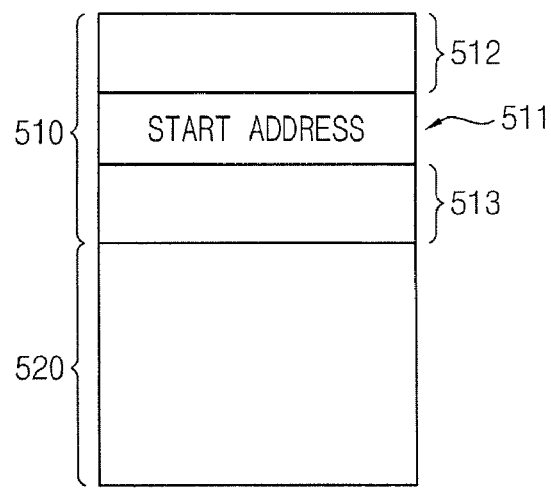

Referring to FIG. 5C, in a circular reading mode, data corresponding to an address range from the start address to a last address of the page may be read, and, thereafter, data corresponding to an address range from a first address of the page to an address prior to the start address are read. When the selection bit of the start address is at the logic low level, data 511 corresponding to the start address START ADDRESS, data 513 corresponding to a second portion of the first address group 510, data corresponding to the second address group 520, and data 512 corresponding to the rest (first portion) of the first address group 510 may be read in that order.

Therefore, when data is read by unit of page in the circular reading mode, data corresponding to all of the first address group 510 and data corresponding to all of the second address group 520 may be read.

Figure 5D:
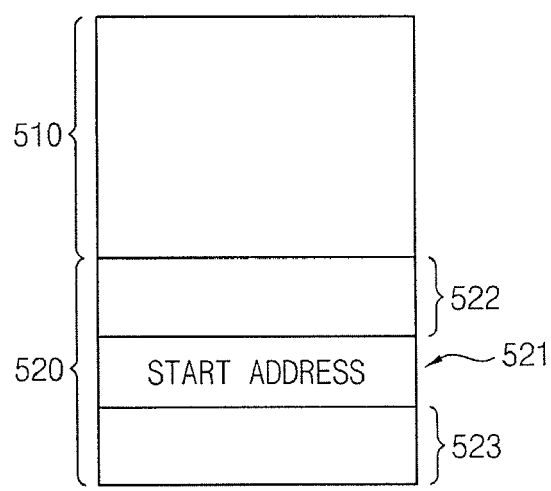

Referring to FIG. 5D, in the circular reading mode, when the selection bit of the start address is at the logic high level, data 521 corresponding to the start address START ADDRESS, data 523 corresponding to a second portion of the second address group 520, data corresponding to the first address group 510, and data 522 corresponding to the rest (first portion) of the second address group 520 may be read in that order.

Figure 6A:
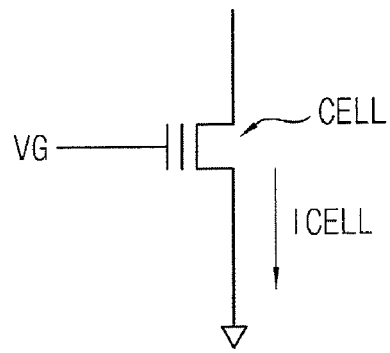
FIG. 6A is a circuit diagram illustrating a multi-level cell in the memory cell array 200 of the non-volatile memory device of FIG. 2.

FIG. 6A is a circuit diagram illustrating a conventional multi-level cell transistor of a non-volatile memory device.

Referring to FIG. 6A, the conventional multi-level cell of the non-volatile memory device may include a transistor CELL having a floating gate. The multi-level cell may store a plurality n of bits of data by a writing operation. In the writing operation of the multi-level cell, a threshold voltage may be controlled by implanting electrons into the floating gate.

A logic state stored in the multi-level cell by the writing operation may be determined by applying a read voltage VG to the control gate of the multi-level cell transistor and sensing a current ICELL flowing through the multi-level cell transistor. Since the multi-level cell stores a plurality of logic states, the multi-level cell may have different threshold voltages than a single-level cell. In reading operation, the logic state stored in the multi-level cell can be determined by successively applying a plurality of read voltages to the control gate of the multi-level cell and sensing a current flowing through the multi-level cell.

Figure 6B:
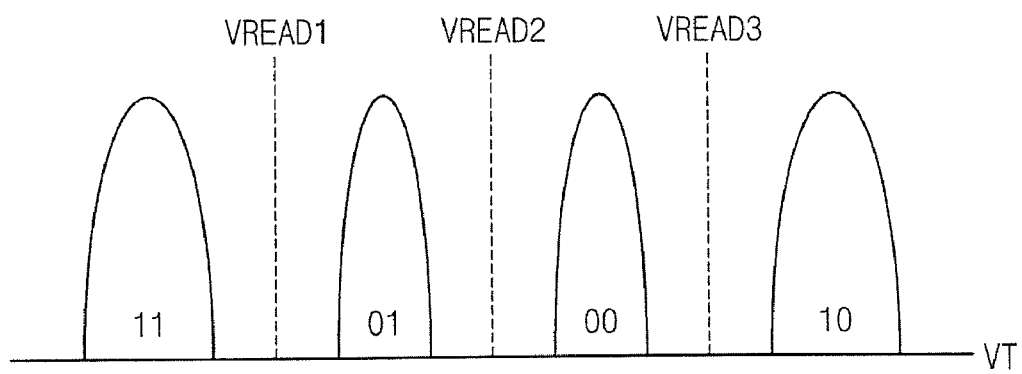
FIG. 6B is a threshold voltage distribution diagram illustrating an example of threshold voltages of multi-level cells and the logic states corresponding to the threshold voltages.

FIG. 6B is a threshold voltage distribution diagram illustrating an example of threshold voltages of a plurality of multi-level cell and logic states corresponding to the threshold voltages.

Figure 7:
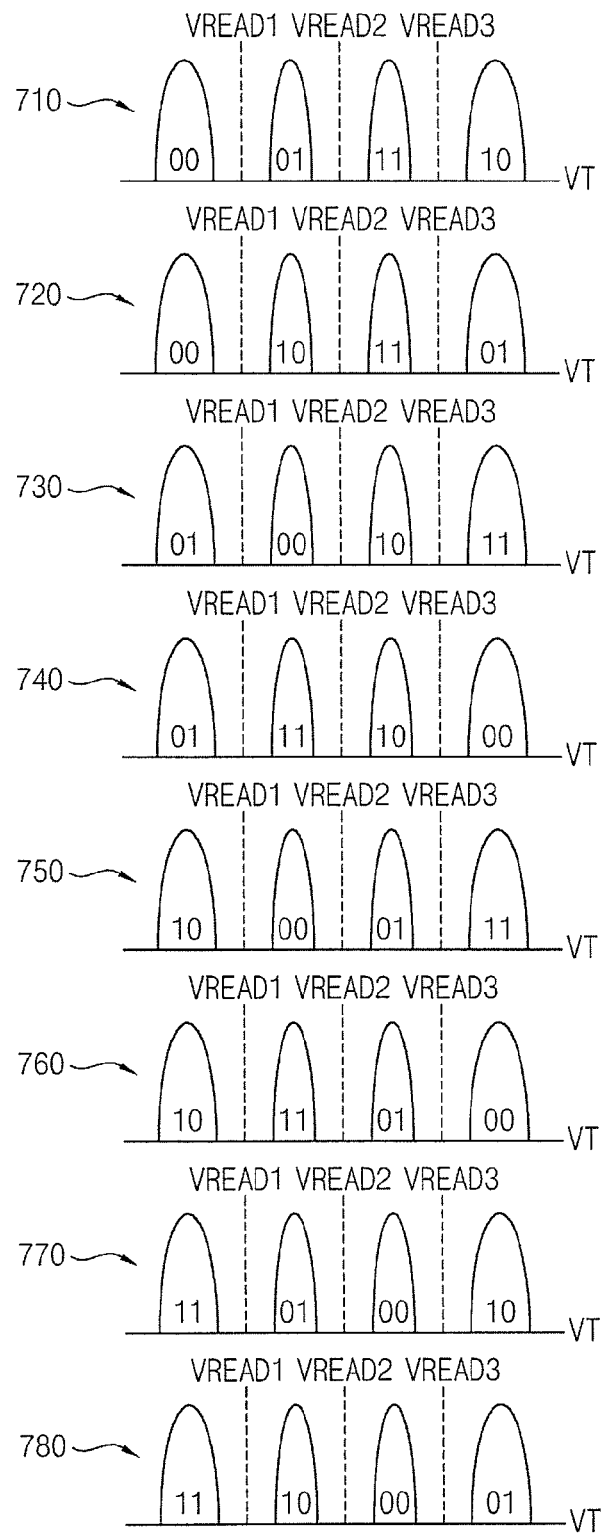
FIG. 7 is a set of threshold voltage distribution diagram illustrating eight possible logic state assignments of a multi-level cell and read voltage sequences used in the method of reading data according to various exemplary embodiments of the invention.

Referring to FIG. 6B, the multi-level cell may store two bits of data. For example, the two bits of data may be in four different logic states, such as '11', '01', '00' and '10' in the increasing order of a threshold voltage VT, according to combinations of logic levels of each bit. Thus, the two (n=2) bits of data may be stored in the multi-level cell by programming the multi-level cell to have four (m=4) different threshold voltages. When the multi-level cell has a first threshold voltage, a logic state of '11' is stored, when the multi-level cell has a second threshold voltage, a logic state of '01' may be stored, when the multi-level cell has a third threshold voltage, a logic state of '00' may be stored, and when the multi-level cell has a fourth threshold voltage, a logic state of '10' may be stored. As illustrated in FIG. 7, each of the logic states and corresponding threshold voltages may be defined variously according to various alternative embodiments.

In the reading mode, the logic state of the multi-level cell can be determined by applying a read voltage to the multi-level cell and sensing a current flowing through the multi-level cell, and the logic level of each bit stored in the multi-level cell can be determined based on the logic state of the multi-level cell.

Hereinafter, the operation of reading the logic level of each bit stored in the multi-level cell will be described in detail.

A first read voltage VREAD1, a second read voltage VREAD2 and a third read voltage VREAD3 may be applied in that order to a word line connected to the multi-level cell, and currents flowing through the multi-level cell, corresponding to each of the three read voltages VREAD1, VREAD2 and VREAD3, may be sensed, respectively. Whether the transistor of the multi-level cell is turned ON can be determined using the sensed currents. The logic state of the multi-level cell can be determined by reference to the read voltage(s) VG at which the transistor of the multi-level cell is turned ON, and data stored in the multi-level cell can be determined based on the determined logic state of the multi-level cell.

For example, when the first read voltage VREAD1, the second read voltage VREAD2 and the third read voltage VREAD3 are applied to the multi-level cell in that order, and the transistor of the multi-level cell is turned ON at all of the three read voltages VREAD1, VREAD2 and VREAD3, the transistor of the multi-level cell has the first threshold voltage. Therefore, the multi-level cell has a logic state of '11'.

When the first read voltage VREAD1, the second read voltage VREAD2 and the third read voltage VREAD3 are applied to the multi-level cell in that order, and the transistor of the multi-level cell is turned OFF at the first read voltage VREAD1 and turned ON at the second read voltage VREAD2 and the third read voltages VREAD3, the transistor of the multi-level cell has the second threshold voltage. Therefore, the multi-level cell has a logic state of '01'.

When the first read voltage VREAD1, the second read voltage VREAD2 and the third read voltage VREAD3 are applied to the multi-level cell in that order, and the transistor of the multi-level cell is turned OFF at the first read voltage VREAD1 and the second read voltage VREAD2 and turned ON at the third read voltages VREAD3, the transistor of the multi-level cell has the third threshold voltage. Therefore, the multi-level cell has a logic state of '00'.

When the first read voltage VREAD1, the second read voltage VREAD2 and the third read voltage VREAD3 are applied to the multi-level cell in that order, and the transistor of the multi-level cell is turned OFF at all of the three read voltages VREAD1, VREAD2 and VREAD3, the transistor of the multi-level cell has the fourth threshold voltage. Therefore, the multi-level cell has a logic state of '10'.

In general, the logic state of the multi-level cell and the two bits of data stored in the multi-level cell can be determined by applying all of the three read voltages VREAD1, VREAD2 and VREAD3 to the multi-level cell. In some exemplary embodiments, the number of applied read voltages may be reduced by controlling the order of application of read voltages. Thus, in the logic states as illustrated in FIG. 6B, when the second read voltage is applied to the multi-level cell, the lower bit among the two bits of the multi-level cell can be determined. When the transistor of the multi-level cell is turned ON at the second read voltage VREAD2, the logic state of the multi-level cell may be one of a first logic state '11' and a second logic state '01'. When the transistor of the multi-level cell is turned OFF at the second read voltage VREAD2, the logic state of the multi-level cell may be one of a third logic state '00' and a fourth logic state '10'. In logic states as illustrated in FIG. 6B, since the lower bit of the first logic state '11' and the second logic state '01' is at the logic high level, and the lower bit of the third logic state '00' and the fourth logic state '10' is at the logic low level, when the second read voltage VREAD2 is applied, the logic level of the lower bit of the multi-level cell can be determined and, therefore, an initial read time may be reduced. When the logic level of the upper bit of the multi-level cell, as well as the lower bit of the multi-level cell, is to be read, reading the logic level of the upper bit by applying the first read voltage VREAD1 and the third read voltage VREAD3 in the order may be performed in parallel with reading the logic level of the lower bit by applying the second read voltage VREAD2. For example, outputting the sensed lower bit may be performed in parallel with sensing the upper bit.

FIG. 7 is a diagram illustrating eight possible logic state assignments of a (m=4) multi-level cell and the read voltage sequences used in the method of reading data according to various exemplary embodiments of the invention.

Referring to FIG. 7, the second read voltage VREAD2 is higher than the first read voltage VREAD1, and the third read voltage VREAD3 is higher than the second read voltage VREAD2.

In some exemplary embodiments illustrated in FIG. 7, some of the bits stored in the multi-level cell may be read by applying only some of the read voltages to the word line connected to the multi-level cell in order to reduce the initial read time. For example, referring to some diagrams 710, 730, 760 and 780, the lower bit of the multi-level cell can be determined by applying only the first read voltage VREAD1 and the third read voltage VREAD3. If the upper bit has to be read with the lower bit, the upper bit of the multi-level cell can be determined by additionally applying the second read voltage VREAD2. In contrast, referring to the rest diagrams 720,

740, 750 and 770, the lower bit of the multi-level cell can be determined by applying only the second read voltage VREAD2. If the upper bit has to be read with the lower bit, the upper bit of the multi-level cell can be determined by additionally applying the first read voltage VREAD1 and the third read voltage VREAD3.

FIGS. 8A to 8D are timing diagrams illustrating reading operations according to a selection bit of a start address in a successive reading mode and in a circular reading mode according to some exemplary embodiments.

In FIGS. 8A to 8D, the second read voltage VREAD2 is higher than the first read voltage VREAD1, and the third read voltage VREAD3 is higher than the second read voltage VREAD2. As illustrated in FIG. 6B, (and in 770 of FIG. 7) the logic states of the multi-level cell may be in four different logic states, such as '11', '01', '00' and '10' in the increasing order of the threshold voltage. In this case, the lower bit of the multi-level cell can be determined using only the second read voltage VREAD2, and the upper bit of the multi-level cell can be determined using the first read voltage VREAD1 and the third read voltage VREAD3.

Figure 8A:
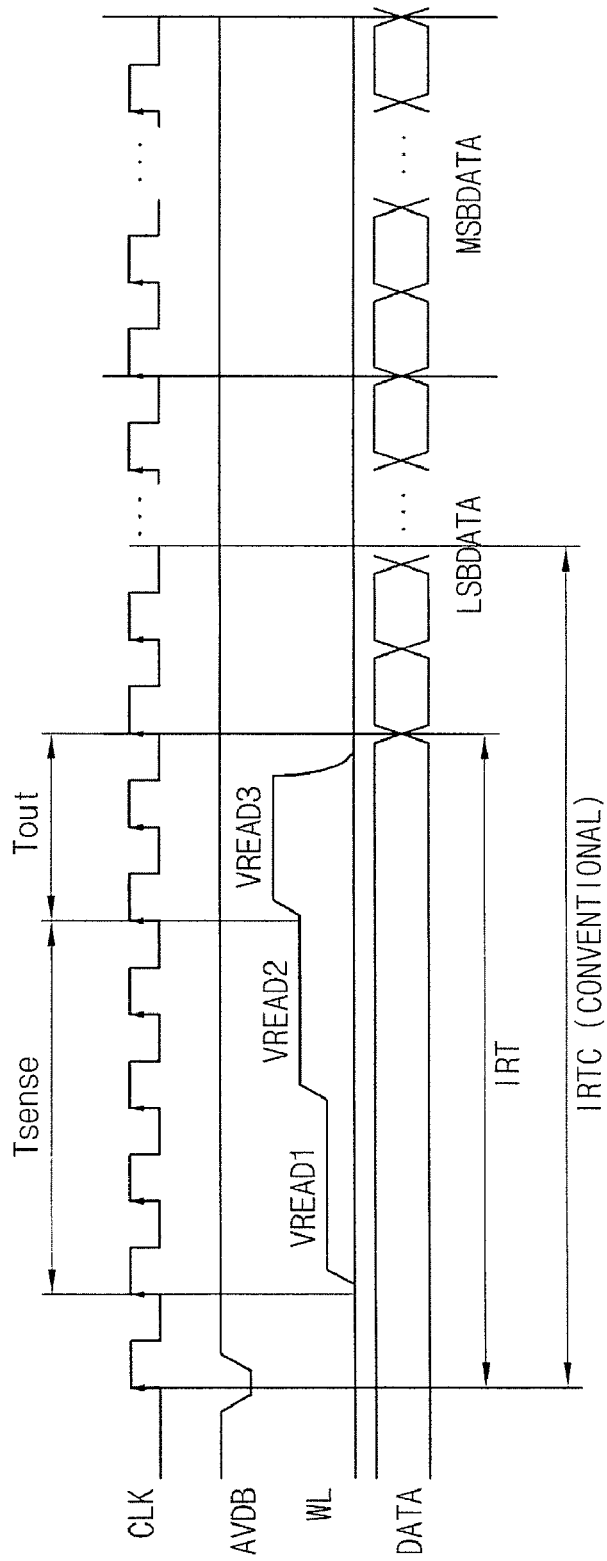
FIGS. 8A to 8D are timing diagrams illustrating reading operations according to a selection bit of a start address in a successive reading mode and in a circular reading mode according to some exemplary embodiments.

FIG. 8A is a diagram illustrating a reading operation when the selection bit of the start address is at the logic low level in the successive reading mode.

Referring to FIG. 8A, the order of reading the plurality of bits of data stored in the multi-level cell can be determined based on the logic level of the selection bit of the start address. When the logic level of the selection bit of the start address is at the logic low level, the logic level of the first bit of the multi-level cell may be read first, and, thereafter, the logic level of the second bit of the multi-level cell may be read. The plurality of read voltages VREAD1, VREAD2 and VREAD3 may be applied to the word line WL according to the determined order of reading. That is, the first read voltage VREAD1, the second read voltage VREAD2, and the third read voltage VREAD3 may be applied to the word line WL in the order. Since the logic level of the first bit of the multi-level cell can be determined first when the logic level of the selection bit of the start address is at the logic low level, the logic level of the first bit can be determined using only the second read voltage VREAD2. Therefore, the first read voltage VREAD1 and the second read voltage VREAD2 may be applied, currents flowing through the multi-level cell may be sensed, and then the logic level of the first bit may be outputted. Thereafter, while the logic level of the first bit is outputted, the third read voltage VREAD3 may be applied to the word line WL, currents flowing through the multi-level cell may be sensed, and then the logic level of the second bit may be outputted. In this manner, after applying the second read voltage VREAD2, the reading operation of the second bit may be performed in parallel with the reading operation of the first bit.

The initial read time IRT represents a time from a start of reading to an output of a first data to be read as a result of a sensing operation and an output operation. That is, as illustrated in FIG. 8A, the initial read time IRT is determined by a sensing time Tsense of the first bit and an output time Tout of the first bit. For example, the sensing time Tsense may represent a time for data stored in the multi-level cell to be latched by a sense amplifier through a bit line, and the output time Tout may represent a time for the latched data to be outputted to an input/output pin through an output buffer. In FIG. 8A, the initial read time IRT is illustrated as a time from a first rising edge of a clock signal CLK after an address valid signal AVDB is activated as a logic low level to an output of the first data to be read. As illustrated in FIG. 8A, an initial read time IRTC of a conventional non-volatile memory device is comparatively long since data output operation is performed after the read voltages VREAD1, VREAD2 and VREAD3 are applied and all of the first bit and the second bit are sensed. In the method of reading data in a non-volatile memory device according to some exemplary embodiments, the initial read time IRT may be reduced since outputting the first bit of the multi-level cell may be performed just after applying only some of the read voltages, that is, before applying the other of the read voltages.

When the selection bit of the start address is at the logic low level in the successive reading mode, both the first bit and the second bit stored in the multi-level cell may be read since data corresponding to addresses which have the selection bit at the logic high level, as well as data corresponding to addresses which have the selection bit at the logic low level, need to be read. As described above, the reading operation of the second bit may be performed in parallel with the reading operation of the first bit after some time of the reading operation of the first bit. That is, after the end of the sensing operation of the first bit, the output operation of the first bit may be performed regardless of the sensing operation of the second bit.

In FIG. 8A, the first read voltage VREAD1, the second read voltage VREAD2 and the third read voltage VREAD3 is applied in the order to read both the first bit and the second bit of the multi-level cell. However, the order of applying the first read voltage VREAD1 and the second read voltage VREAD2 may be changed in other embodiments.

When a time for the sensing operation of the second bit by applying the third read voltage VREAD3 to the word line WL is longer than a time for the output operation of the first bit, a predetermined time interval may be inserted between the reading operation of the first bit and the reading operation of the second bit.

In the successive reading mode, data corresponding to a next page may be read after data corresponding to a last address of a current page is read.

Figure 8B:
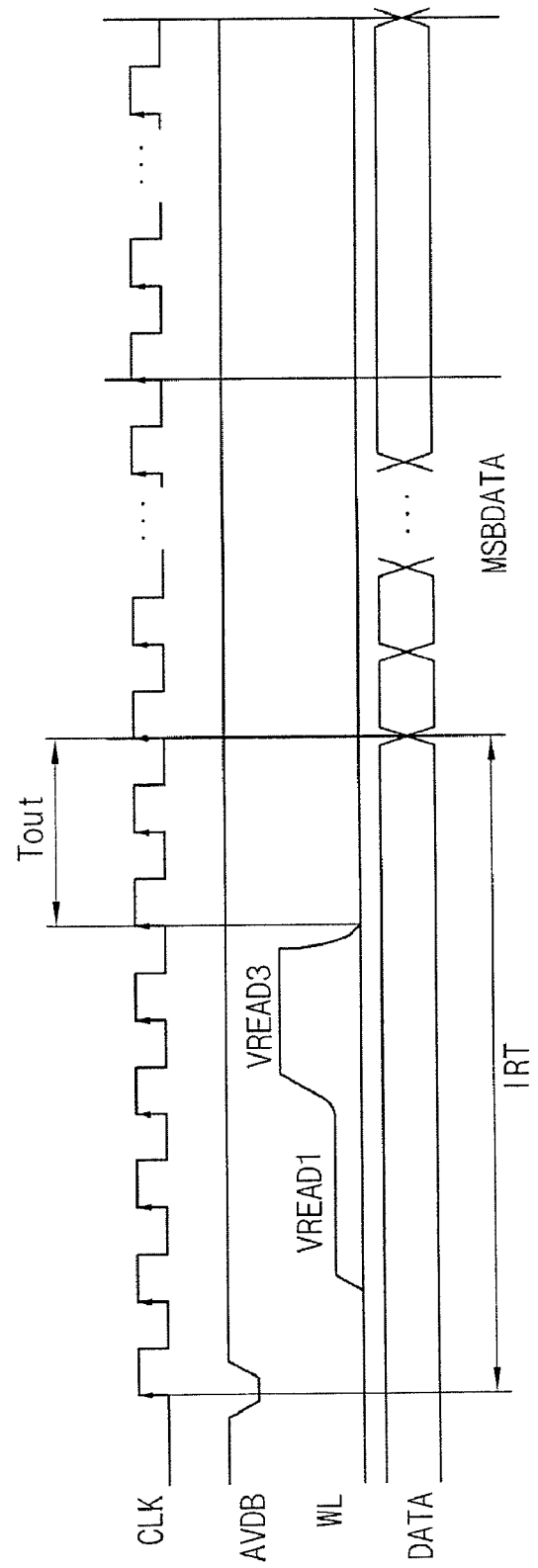

FIG. 8B is a diagram illustrating a reading operation when the selection bit of the start address is at the logic high level in the successive reading mode.

Referring to FIG. 8B, when the logic level of the selection bit of the start address is at the logic high level, the logic level of the second bit of the multi-level cell may be read. The logic level of the second bit can be determined using only the first read voltage VREAD1 and the third read voltage VREAD3. Therefore, the first read voltage VREAD1 and the third read voltage VREAD3 may be applied in the order, and then the logic level of the second bit may be outputted.

In FIG. 8B, the first read voltage VREAD1 and the third read voltage VREAD3 is applied in the order to read the second bit of the multi-level cell. However, the order of applying the first read voltage VREAD1 and the third read voltage VREAD3 may be changed in other embodiments.

When a time for the sensing operation of the first bit of a next page is longer than a time for the output operation of the second bit of a current page, a predetermined time interval may be inserted between the reading operation of the current page and the reading operation of the next page.

As described above, the initial read time IRT both in the case of reading the first bit first as illustrated in FIG. 8A and in the case of reading the second bit first as illustrated in FIG. 8B may be reduced by controlling the order of applying the read voltages based on which bit is read first.

Figure 8C:
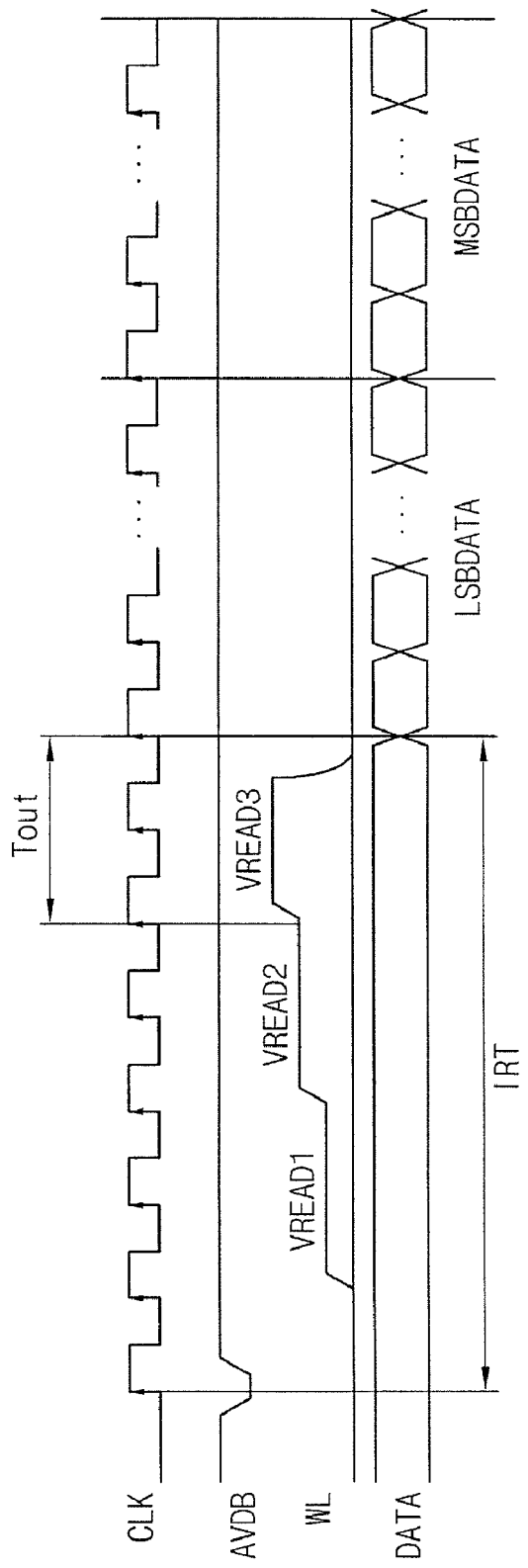

FIG. 8C is a diagram illustrating a reading operation when the selection bit of the start address is at the logic low level in the circular reading mode.

Referring to FIG. 8C, when the logic level of the selection bit of the start address is at the logic low level, the logic level of the first bit of the multi-level cell is be read first, and, thereafter, the logic level of the second bit of the multi-level cell is read. The first read voltage VREAD1, the second read voltage VREAD2, and the third read voltage VREAD3 may be applied to the word line WL in that order. Since the logic level of the first bit of the multi-level cell can be determined first when the logic level of the selection bit of the start address is at the logic low level, the logic level of the first bit can be determined using only the second read voltage VREAD2. Therefore, the first read voltage VREAD1 and the second read voltage VREAD2 may be applied, and then the logic level of the first bit may be outputted. Thereafter, while the logic level of the first bit is outputted, the third read voltage VREAD3 is applied to the word line WL, currents flowing through the multi-level cell may be sensed, and then the logic level of the second bit is outputted. In this manner, after applying the second read voltage VREAD2, the reading operation of the second bit may be performed in parallel with the reading operation of the first bit.

The initial read time IRT may be reduced since the reading operation of the first bit of the multi-level cell may be performed by applying only some of the read voltages.

When the selection bit of the start address is at the logic low level in the circular reading mode, both the first bit and the second bit stored in the multi-level cell can be read since data corresponding to addresses that have the selection bit at the logic high level, as well as data corresponding to addresses which have the selection bit at the logic low level, need to be read. As described above, the reading operation of the second bit can be performed in parallel with the reading operation of the first bit after some time of the reading operation of the first bit.

In FIG. 8C, the first read voltage VREAD1, the second read voltage VREAD2 and the third read voltage VREAD3 are applied in that order to read both the first bit and the second bit of the multi-level cell. However, the order of applying the first read voltage VREAD1 and the second read voltage VREAD2 may be changed in other embodiments.

When the time for the sensing operation of the second bit by applying the third read voltage VREAD3 to the word line WL is longer than the time for the output operation of the first bit, a predetermined time interval may be inserted between the reading operation of the first bit and the reading operation of the second bit.

In the circular reading mode, data corresponding to a first address of a current page may be read after data corresponding to the last address of the current page is read.

Figure 8D:
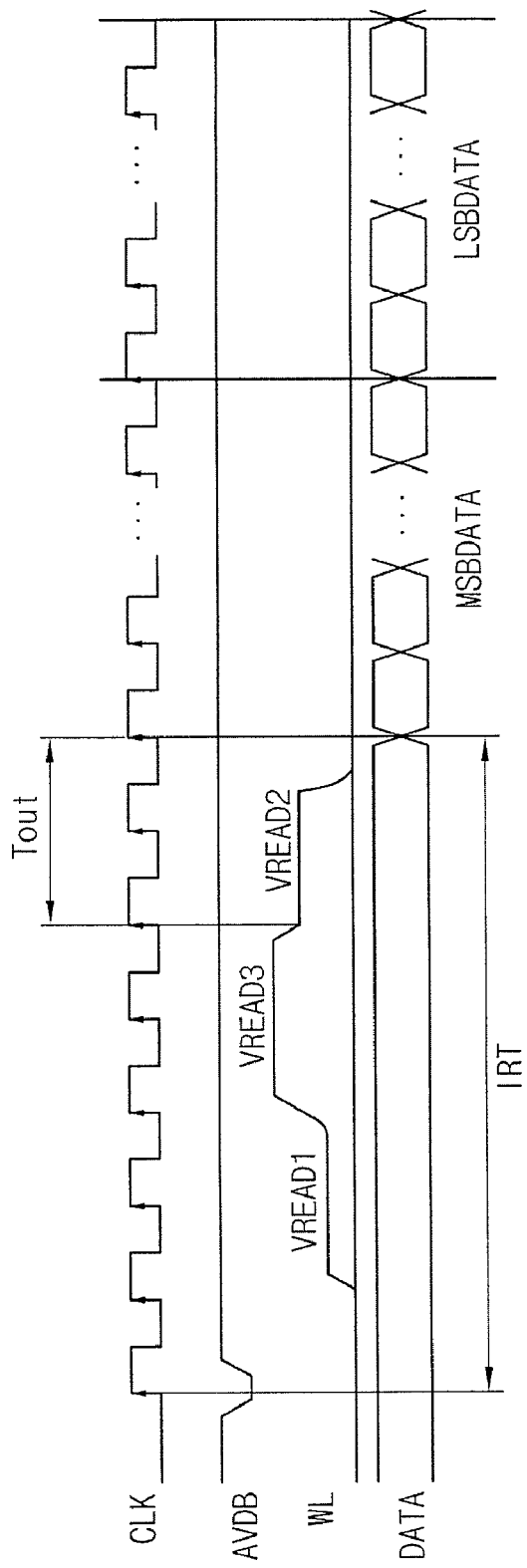

FIG. 8D is a diagram illustrating a reading operation when the selection bit of the start address is at the logic high level in the circular reading mode.

Referring to FIG. 8D, when the logic level of the selection bit of the start address is at the logic high level, the logic level of the second bit of the multi-level cell is read first, and, thereafter, the logic level of the first bit of the multi-level cell is read. The first read voltage VREAD1, the third read voltage VREAD3, and the second read voltage VREAD2 are applied to the word line WL in that order. Since the logic level of the second bit of the multi-level cell can be determined first when the logic level of the selection bit of the start address is at the logic high level, the logic level of the second bit can be determined using only the first read voltage VREAD1 and the third read voltage VREAD3. Therefore, the first read voltage VREAD1 and the third read voltage VREAD3 are applied, and then the logic level of the second bit is outputted. Thereafter, while the logic level of the second bit is outputted, the second read voltage VREAD2 is applied to the word line WL, currents flowing through the multi-level cell may be sensed, and then the logic level of the first bit is outputted. In this manner, after applying the third read voltage VREAD3, the reading operation of the first bit can be performed in parallel with the reading operation of the second bit.

The initial read time IRT may be reduced since the reading operation of the second bit of the multi-level cell can be performed by applying only some of the read voltages.

When the selection bit of the start address is at the logic high level in the circular reading mode, both the first bit and the second bit stored in the multi-level cell can be read since data corresponding to addresses which have the selection bit at the logic low level, as well as data corresponding to addresses which have the selection bit at the logic high level, need to be read. As described above, the reading operation of the first bit can be performed in parallel with the reading operation of the second bit after some time of the reading operation of the second bit.

In FIG. 8D, the first read voltage VREAD1, the third read voltage VREAD3 and the second read voltage VREAD2 are applied in that order to read both the first bit and the second bit of the multi-level cell. However, the order of applying the first read voltage VREAD1 and the third read voltage VREAD3 may be changed in other embodiments.

When the time for the sensing operation of the first bit by applying the second read voltage VREAD2 to the word line WL is longer than a time for the output operation of the second bit, a predetermined time interval may be inserted between the reading operation of the second bit and the reading operation of the first bit.

FIGS. 9A to 9D are timing diagrams illustrating reading operations according to a selection bit of a start address in a successive reading mode and in a circular reading mode according to other exemplary embodiments.

In FIGS. 9A to 9D, the second read voltage VREAD2 is higher than the first read voltage VREAD1, and the third read voltage VREAD3 is higher than the second read voltage VREAD2. The logic states of the multi-level cell may be in four different logic states, such as '11', '10', '00' and '01' in the increasing order of the threshold voltage, which is different from the order of FIG. 6B. In this case, the upper bit of the multi-level cell can be determined using the second read voltage VREAD2, and the lower bit of the multi-level cell can be determined using the first read voltage VREAD1 and the third read voltage VREAD3.

Figure 9A:
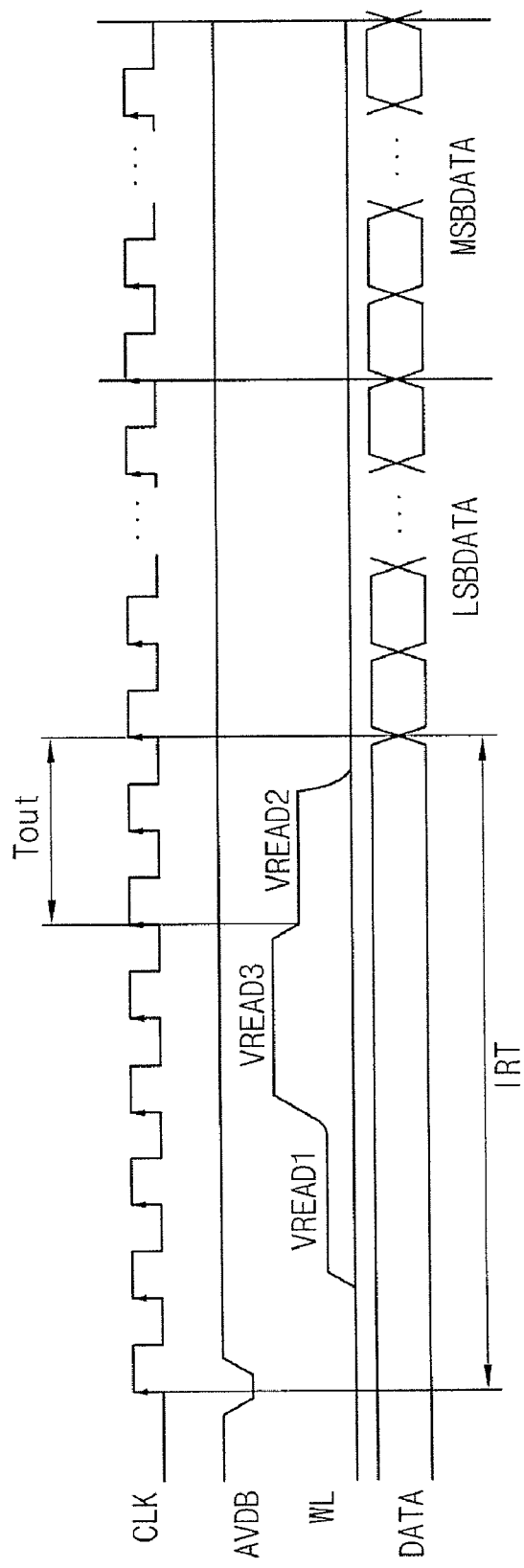
FIGS. 9A to 9D are timing diagrams illustrating reading operations according to a selection bit of a start address in a successive reading mode and in a circular reading mode according to other exemplary embodiments.

FIG. 9A is a timing diagram illustrating a reading operation when the selection bit of the start address is at the logic low level in the successive reading mode.

Referring to FIG. 9A, the order of reading the plurality of bits of data stored in the multi-level cell can be selected based on the logic level of the selection bit of the start address. When the logic level of the selection bit of the start address is at the logic low level, the logic level of the first bit of the multi-level cell may be read first, and, thereafter, the logic level of the second bit of the multi-level cell may be read. The plurality of read voltages VREAD1, VREAD2 and VREAD3 may be applied to a word line WL according to the selected order of reading. Thus, the first read voltage VREAD1, the third read voltage VREAD3, and the second read voltage VREAD2 may be applied to the word line WL in that order. Since the logic level of the first bit of the multi-level cell can be determined first when the logic level of the selection bit of the start address is at the logic low level, the logic level of the first bit can be determined using only the first read voltage VREAD1 and the third read voltage VREAD3. Therefore, the first read voltage VREAD1 and the third read voltage VREAD3 may be applied, currents flowing through the multi-level cell may be sensed, and then the logic level of the first bit may be outputted. Thereafter, while the logic level of the first bit is outputted, the second read voltage VREAD2 may be applied to the word line WL, currents flowing through the multi-level cell may be sensed, and then the logic level of the second bit may be outputted. In this manner, after applying the third read voltage VREAD3, the reading operation of the second bit may be performed in parallel with the reading operation of the first bit.

When the selection bit of the start address is at the logic low level in the successive reading mode, both the first bit and the second bit stored in the multi-level cell may be read since data corresponding to addresses which have the selection bit at the logic high level, as well as data corresponding to addresses which have the selection bit at the logic low level, need to be read. As described above, the reading operation of the second bit may be performed in parallel with the reading operation of the first bit after some time of the reading operation of the first bit.

In FIG. 9A, the first read voltage VREAD1, the third read voltage VREAD3 and the second read voltage VREAD2 is applied in that order to read both the first bit and the second bit of the multi-level cell. However, the order of applying the first read voltage VREAD1 and the third read voltage VREAD3 may be changed in other embodiments.

When a time for the sensing operation of the second bit by applying the second read voltage VREAD2 to the word line WL is longer than a time for the output operation of the first bit, a predetermined time interval may be inserted between the reading operation of the first bit and the reading operation of the second bit.

Figure 9B:
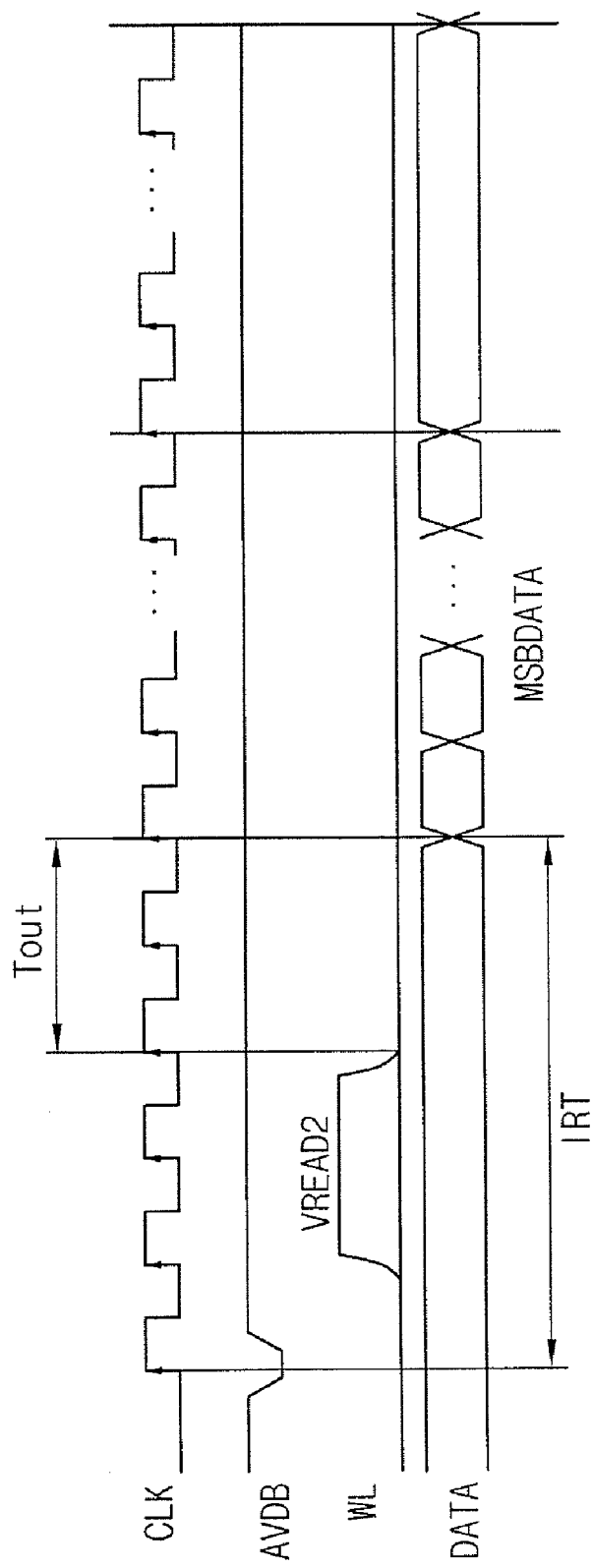

FIG. 9B is a diagram illustrating a reading operation when the selection bit of the start address is at the logic high level in the successive reading mode.

Referring to FIG. 9B, when the logic level of the selection bit of the start address is at the logic high level, the logic level of the second bit of the multi-level cell can be read using only one read voltage. The logic level of the second bit can be determined by applying the second read voltage VREAD2 to the word line WL. Since the logic level of the second bit of the multi-level cell is determined when the logic level of the selection bit of the start address is at the logic high level, the logic level of the second bit can be determined using only the second read voltage VREAD2. Therefore, the second read voltage VREAD2 is applied, and then the logic level of the second bit may be outputted. When the time for the sensing operation of the first bit of a next page is longer than a time for the output operation of the second bit of a current page, a predetermined time interval may be inserted between the reading operation of the current page and the reading operation of the next page.

Figure 9C:
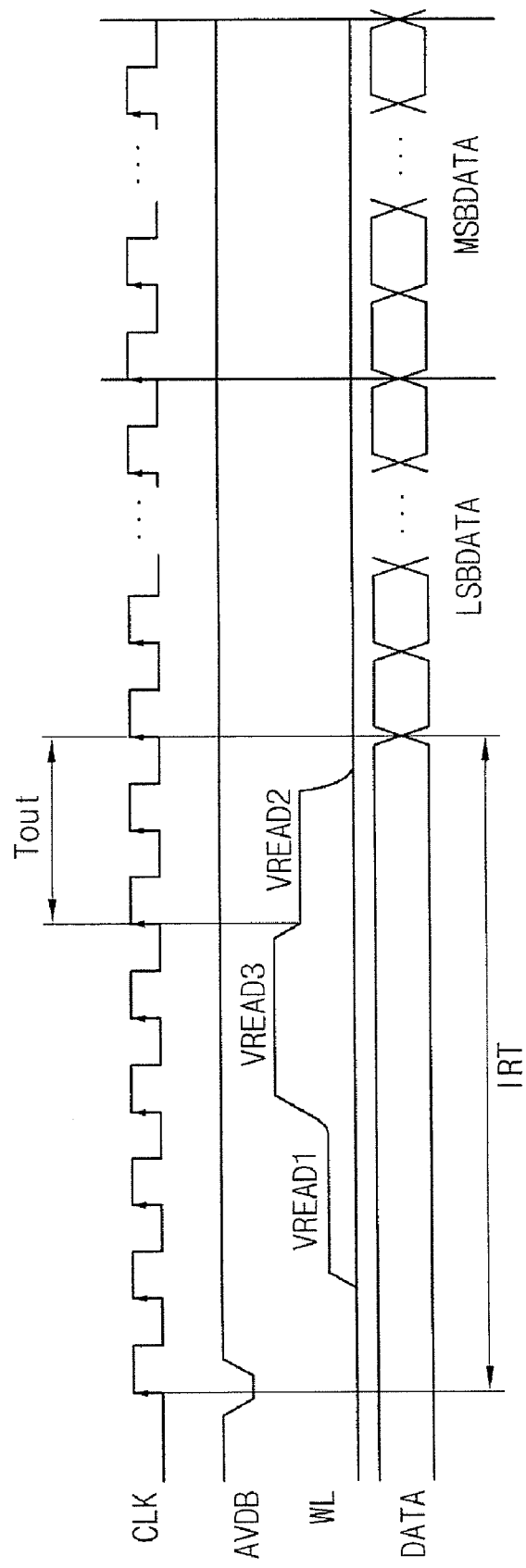

FIG. 9C is a timing diagram illustrating a reading operation when the selection bit of the start address is at the logic low level in the circular reading mode.

Referring to FIG. 9C, when the logic level of the selection bit of the start address is at the logic low level, the logic level of the first bit of the multi-level cell is read first, and, thereafter, the logic level of the second bit of the multi-level cell is read. The first read voltage VREAD1, the third read voltage VREAD3, and the second read voltage VREAD2 may be applied to the word line WL in that order. Since the logic level of the first bit of the multi-level cell can be determined first when the logic level of the selection bit of the start address is at the logic low level, the logic level of the first bit can be determined using only the first read voltage VREAD1 and the third read voltage VREAD3. Therefore, the first read voltage VREAD1 and the third read voltage VREAD3 may be applied, and then the logic level of the first bit may be output.

Thereafter, while the logic level of the first bit is output, the second read voltage VREAD2 is applied to the word line WL, currents flowing through the multi-level cell are sensed, and then the logic level of the second bit is outputted. In this manner, after applying the third read voltage VREAD3, the reading operation of the second bit can be performed in parallel with the reading operation of the first bit.

When the selection bit of the start address is at the logic low level in the circular reading mode, both the first bit and the second bit stored in the multi-level cell may be read since data corresponding to addresses which have the selection bit at the logic high level, as well as data corresponding to addresses which have the selection bit at the logic low level, need to be read. As described above, the reading operation of the second bit can be performed in parallel with the reading operation of the first bit after some time of the reading operation of the first bit.

In FIG. 9C, the first read voltage VREAD1, the third read voltage VREAD3 and the second read voltage VREAD2 is applied in that order to read both the first bit and the second bit of the multi-level cell. However, the order of applying the first read voltage VREAD1 and the third read voltage VREAD3 may be changed in other embodiments.

When a time for the sensing operation of the second bit by applying the second read voltage VREAD2 to the word line WL is longer than a time for the output operation of the first bit, a predetermined time interval may be inserted between the reading operation of the first bit and the reading operation of the second bit.

Figure 9D:
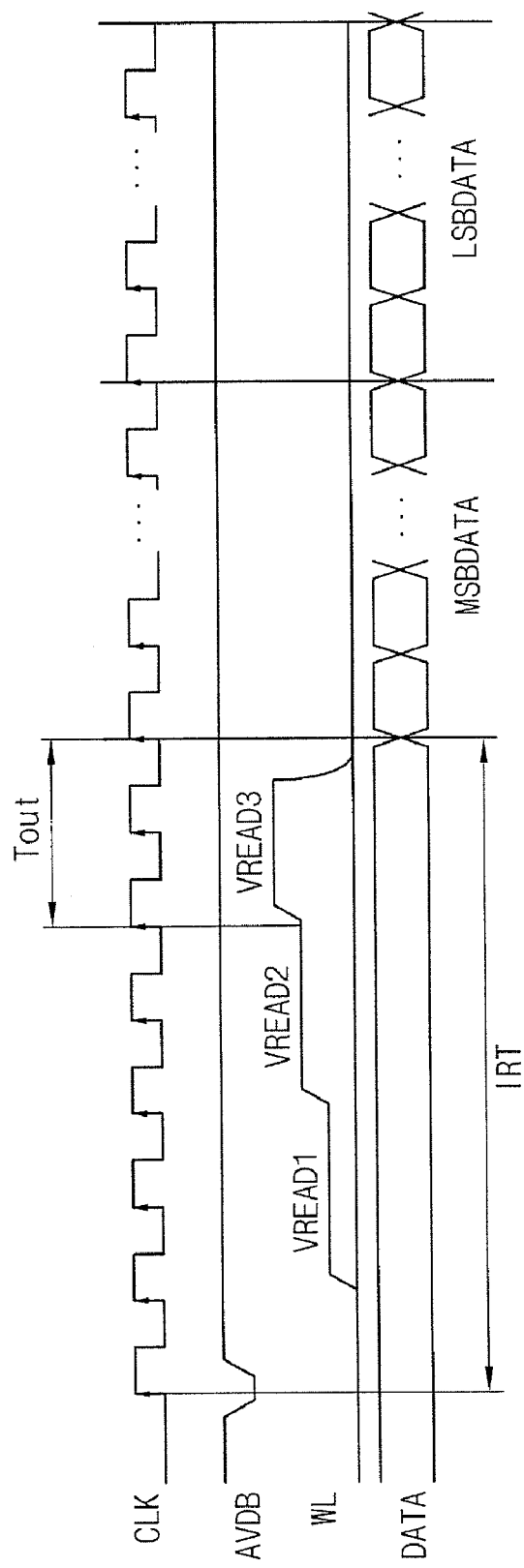

FIG. 9D is a timing diagram illustrating a reading operation when the selection bit of the start address is at the logic high level in the circular reading mode.

Referring to FIG. 9D, when the logic level of the selection bit of the start address is at the logic high level, the logic level of the second bit of the multi-level cell may be read first, and, thereafter, the logic level of the first bit of the multi-level cell may be read. The first read voltage VREAD1, the second read voltage VREAD2, and the third read voltage VREAD3 are applied to the word line WL in that order. Since the logic level of the second bit of the multi-level cell can be determined first when the logic level of the selection bit of the start address is at the logic high level, the logic level of the second bit can be determined using only the second read voltage VREAD2. Therefore, the first read voltage VREAD1 and the second read voltage VREAD2 may be applied, and then the logic level of the second bit may be outputted. Thereafter, while the logic level of the second bit is being outputted, the third read voltage VREAD3 are applied to the word line WL, currents flowing through the multi-level cell are sensed, and then the logic level of the first bit is outputted. In this manner, after applying the second read voltage VREAD2, the reading operation of the first bit can be performed in parallel with the reading operation of the second bit.

When the selection bit of the start address is at the logic high level in the circular reading mode, both the first bit and the second bit stored in the multi-level cell may be read since data corresponding to addresses which have the selection bit at the logic low level, as well as data corresponding to addresses which have the selection bit at the logic high level, need to be read. As described above, the reading operation of the first bit can be performed in parallel with the reading operation of the second bit after some time of the reading operation of the second bit.

In FIG. 9D, the first read voltage VREAD1, the second read voltage VREAD2 and the third read voltage VREAD3 is applied in that order to read both the first bit and the second bit of the multi-level cell. However, the order of applying the first read voltage VREAD1 and the second read voltage VREAD2 may be changed in other embodiments.

When a time for the sensing operation of the first bit by applying the third read voltage VREAD3 to the word line WL is longer than a time for the output operation of the second bit, a predetermined time interval may be inserted between the reading operation of the second bit and the reading operation of the first bit.

Figure 10:
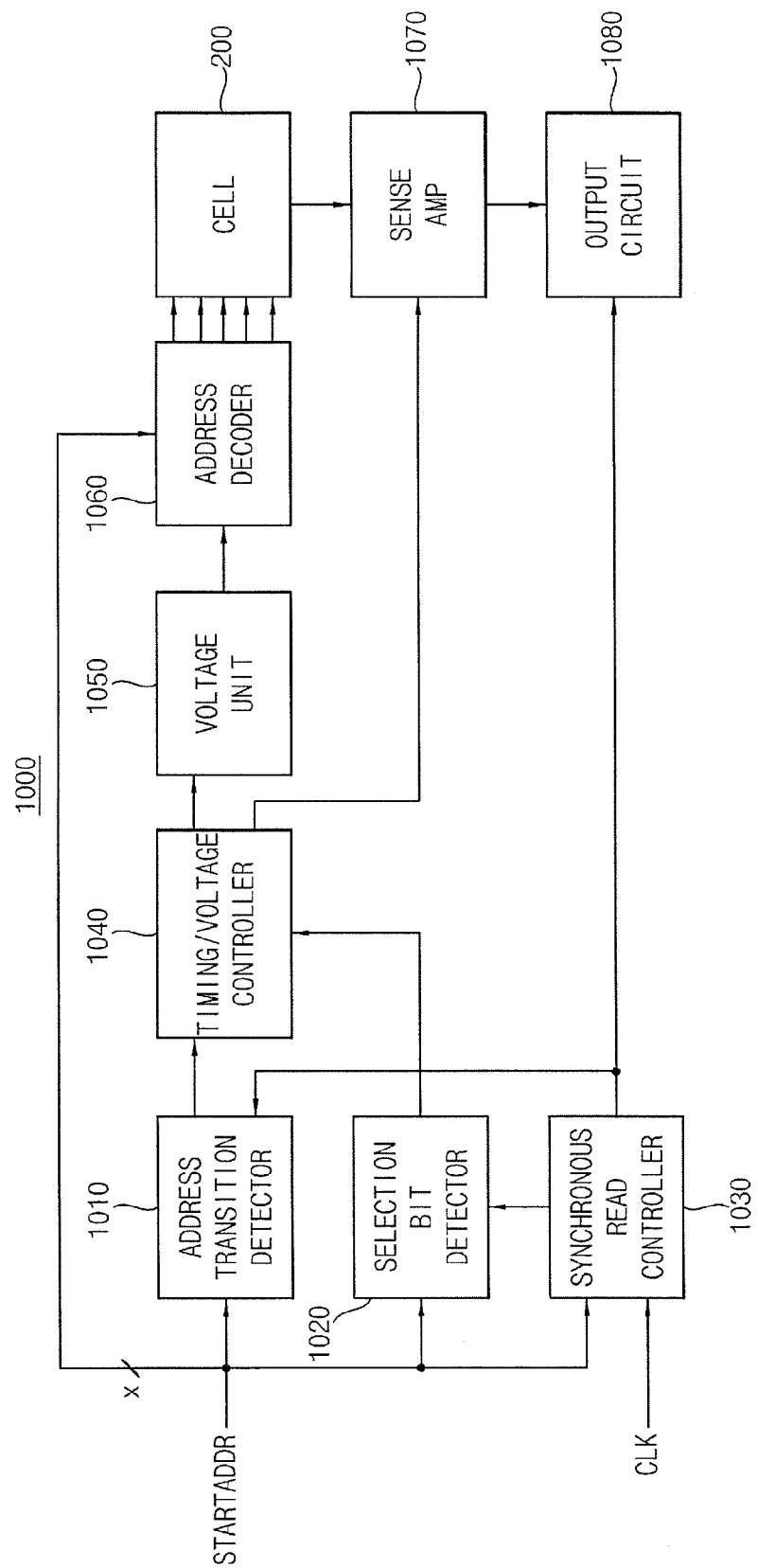
FIG. 10 is a block diagram of a non-volatile memory device according to some exemplary embodiments.

FIG. 10 is a block diagram of a non-volatile memory device according to some above described exemplary embodiments.

Referring to FIG. 10, a non-volatile memory device 1000 may include an address transition detector 1010, a selection bit detector 1020, a synchronous read controller 1030, a timing and voltage controller 1040, a voltage unit 1050, an address decoder 1060, a memory cell array 200, a sense amplifier 1070 and an output circuit 1080.

The address transition detector 1010 detects a transition of the start address STARTADDR. When the transition of the start address is detected, the non-volatile memory device 1000 starts a reading operation with respect to the transitioned start address.

The selection bit detector 1020 determines the logic level of the selection bit of the start address.

The synchronous read controller 1030 synchronizes other units based on the start address STARTADDR and a clock signal CLK.

The timing and voltage controller 1040 determine an order of reading the plurality of bits of data stored in the multi-level cells based on the detection of the detected transition of the start address and the logic level of the selection bit. The timing and voltage controller 1040 control a sensing timing of the sense amplifier 1070 based on the expected applied time of a plurality of read voltages.

The voltage unit 1050 generates each of the plurality of read/write wordline voltages to be applied, through the address decoder 1060, to a selected word line WL connected to a plurality of the memory cells of the memory cell array 200. The read/write wordline voltages generated by the voltage unit 1050 depends upon the selection bit(s) of a read/write address. The timing and voltage controller 1040 controls the order of applying the plurality of read voltages generated by the voltage unit based on an output of the selection bit detector 1020 based on the selection bit(s) of a received address. The selection bit(s) of a write address controls the order of applying the plurality of write voltages generated by the voltage unit under the control of control signals from the timing and voltage controller 1040.

The sense amplifier 1070 performs the sensing operation by sensing and latching data stored in the memory cells of the memory cell array 200 through bit lines while the read voltages are applied to the word line.

The output circuit 1080 performs the output operation by buffering and outputting the latched data.

An apparatus including the non-volatile memory device of FIG. 10 may further include a memory controller (not shown) for controlling the nonvolatile memory device and that includes a host-interface circuit that implements a standardized interface protocol selected from: Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE).

As described above, the method of reading data in a non-volatile memory device and the method of inputting and outputting data in a non-volatile memory device can reduce the initial read time by controlling the order of reading the plurality of bits of data stored in the multi-level cell and reading data according to the optimized order of reading.

Although the method of reading data and the method of inputting and outputting data are described using the multi-level cell storing two bits of data, the present inventive concept may be used in the method of reading data in a non-volatile memory device including the multi-level cell storing more than two bits (e.g., n greater than 2) of data to reduce the initial read time.

Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of reading data in a non-volatile memory device, comprising:
reading first and second bits of data stored in one multi-level cell corresponding to an address, wherein the order of reading the first and second bits of data is selected based on a logic level of a selection bit of an address; and
sensing and outputting the first and second bits of data.

2. The method of claim 1, wherein at least one bit of data among the first and second bits of data is output before sensing all of the first and second bits of data.

3. The method of claim 1, wherein selecting the order of reading the first and second bits of data includes:
selecting the order of applying a plurality of read voltages to a word line connected to the one multi-level memory cell based on the logic level of the selection bit.

4. The method of claim 3, wherein sensing and outputting the first and second bits of data includes:
sensing the first bit of data among the first and second bits of data by applying at least one read voltage among the plurality of read voltages to the word line according to the selected order of applying read voltages; and
outputting the first bit of data regardless of applying remaining read voltage(s) among the plurality of read voltages.

5. The method of claim 4, wherein sensing and outputting the first and second bits of data includes:
sensing and outputting the second bit of data among the first and second bits of data by applying the remaining read voltage among the plurality of read voltages to the word line in parallel with outputting the first bit of data.

6. The method of claim 3, wherein the plurality of read voltages include a first read voltage, a second read voltage and a third read voltage, and
wherein selecting the order of reading the first and second bits of data includes:
selecting the order of applying the first read voltage, the second read voltage and the third read voltage based on the logic level of the selection bit.

7. The method of claim 6, wherein selecting the order of reading the first and second bits of data includes selecting between:

applying the first read voltage, the second read voltage and the third read voltage in that order to output the first bit of data first if the logic level of the selection bit is at a first logic level; and applying the first read voltage, the third read voltage and the second read voltage in that order to output the second bit of data first if the logic level of the selection bit is at a second logic level.

8. The method of claim 1, wherein the address is a start address of read data corresponding to one page.

9. A method of inputting and outputting data in a nonvolatile memory device, comprising:

in a writing mode, inputting data into a first bit among first and second bits of a multi-level memory cell if a selection bit of a write address is at a first logic level; and in the writing mode, inputting data into the second bit of the multi-level memory cell if the selection bit of the write address is at a second logic level.

10. The method of claim 9, wherein inputting data includes:

in a reading mode, selecting the order of reading the first and second bits of data stored in the multi-level memory cell based on a logic level of a selection bit of a read address.

11. The method of claim 10, further comprising:

in the reading mode, outputting the first and second bits of data from the non-volatile memory device according to the selected order of reading.

12. The method of claim 10, wherein selecting the order of reading the first and second bits of data includes selecting between:

applying a first read voltage, a second read voltage and a third read voltage in that order to output the first bit of data first if the logic level of the selection bit of the read address is at a first logic level; and applying the first read voltage, the third read voltage and the second read voltage in that order to output the second bit of data first if the logic level of the selection bit of the read address is at a second logic level.

13. The method of claim 9, wherein inputting data includes:

inputting data into the first bit of the multi-level memory cell if the logic level of the selection bit of the write address is "0"; and inputting data into the second bit of the multi-level memory cell if the logic level of the selection bit of the write address is "1".

14. An apparatus comprising:

a nonvolatile memory device including:

an array of n-level memory cells including a plurality $2^x$ of n-word units, wherein n is an integer greater than one, and each of the n-word units includes a plurality of the n-level memory cells;

an address decoder configured to receive an x-bit address and to select a selected one of the $2^x$ of n-word units based on the received x-bit address, wherein the x-bit address is a portion of the bits of a received address; and a selection bit detector configured to detect a logic level of a selection bit of the received address, wherein the selection bit is not a bit of the x-bit address.

15. The apparatus of claim 14, wherein:

in a writing mode, the nonvolatile memory device inputs data into a first bit among first and second bits of one n-level memory cell if a selection bit of the received write address is at a first logic level; and in the writing mode, the nonvolatile memory device inputs data into the second bit of the n-level memory cell if the selection bit of the received write address is at a second logic level.

16. The apparatus of claim 15, wherein in a reading mode, the nonvolatile memory device selects the order of reading the first and second bits of data stored in the n-level memory cell based on the logic level of a selection bit of the received read address.

17. The apparatus of claim 16, wherein in the reading mode, the nonvolatile memory device outputs the first and second bits of data according to the selected order of reading.

18. The apparatus of claim 16, wherein selecting the order of reading the first and second bits of data includes selecting between:

applying a first read voltage, a second read voltage and a third read voltage in that order to output the first bit of data first if the logic level of the selection bit of the read address is at a first logic level; and applying the first read voltage, the third read voltage and the second read voltage in that order to output the second bit of data first if the logic level of the selection bit of the read address is at a second logic level.

19. The apparatus of claim 16, wherein inputting data in the writing mode, includes:

inputting data into the first bit of the n-level memory cell if the logic level of the selection bit of the write address is "0".

20. The apparatus of claim 18, wherein inputting data in the writing mode, further includes:

inputting data into the second bit of the n-level memory cell if the logic level of the selection bit of the write address is "1".

21. The apparatus of claim 14, further comprising a memory controller configured to transmit the address received by the nonvolatile memory device and including a host-interface circuit that implements a standardized interface protocol selected from: Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), external SATA (eSATA), Small Computer Small Interface (SCSI), Enhanced Small Disk Interface (ESDI), and Integrated Drive Electronics (IDE).

* * * * *